United States Patent [19]
Highum et al.

[11] Patent Number: 5,714,102
[45] Date of Patent: Feb. 3, 1998

[54] METHOD FOR MANUFACTURING ELECTRO-MAGNETIC SHIELD HAVING MULTIPLE POLYMERIC LAYERS OF DIFFERING FILL COMPOSITIONS

[75] Inventors: Edward Allan Highum, Kasson; Alfred Wilhelm Mueller; Thomas William Nash, both of Rochester, all of Minn.; Ewald Emil Gottlob Stadler, Herrenberg, Germany; Scott Marvin Thorvilson, Rochester, Minn.

[73] Assignee: International Business Machines Corporation, Armonk, N.Y.

[21] Appl. No.: 425,271

[22] Filed: Apr. 20, 1995

Related U.S. Application Data

[62] Division of Ser. No. 197,574, Feb. 15, 1994, abandoned, which is a continuation of Ser. No. 816,696, Jan. 2, 1992, abandoned.

[51] Int. Cl.$^6$ .................................................. B29C 45/16
[52] U.S. Cl. ........................ 264/105; 264/255; 264/328.8
[58] Field of Search ................................ 264/332, 109, 264/272.19, 105, 255, 328.8

[56] References Cited

U.S. PATENT DOCUMENTS

| | | | |
|---|---|---|---|
| 3,576,387 | 4/1971 | Derby | 174/DIG. 8 |
| 4,095,627 | 6/1978 | Lonseth et al. | 264/272.19 |
| 4,168,192 | 9/1979 | Nyberg | 174/DIG. 8 |
| 4,320,080 | 3/1982 | Esper et al. | 264/86 |
| 4,471,015 | 9/1984 | Ebneth et al. | 428/195 |
| 4,474,685 | 10/1984 | Annis | 252/503 |
| 4,528,213 | 7/1985 | Nelson et al. | 427/105 |
| 4,566,990 | 1/1986 | Liu et al. | 252/503 |
| 4,634,615 | 1/1987 | Versteegh et al. | 428/36 |
| 4,678,699 | 7/1987 | Kritchevshy et al. | 428/175 |
| 4,690,778 | 9/1987 | Narumiya et al. | 252/506 |

(List continued on next page.)

FOREIGN PATENT DOCUMENTS

| | | |
|---|---|---|
| 0048987 | 4/1982 | European Pat. Off. . |
| 0180383 | 5/1986 | European Pat. Off. . |
| 0317467 | 5/1989 | European Pat. Off. . |
| 0437979 | 7/1991 | European Pat. Off. . |
| 2167671 | 8/1973 | France . |
| 58-101499 | 6/1983 | Japan . |
| 60-129196 | 8/1985 | Japan . |
| 60-148195 | 8/1985 | Japan . |
| 1261897 | 10/1989 | Japan . |

OTHER PUBLICATIONS

Electronic Packaging & Production (aka EP&) Jan. 1991 pp. 40–44 "Shielding Electronics From EMI/RFI" by H. W. Markstein.

Database WPIL Week 8330, Derwent Publications Ltd., London, GB; AN 83–719584 & JP–A–58 101 499 (Yamamoto H), Jun. 16, 1983 (abstract).

*Primary Examiner*—Angela Y. Ortiz
*Attorney, Agent, or Firm*—Roy W. Truelson

[57] ABSTRACT

An enclosure for an electronic device forms a barrier to electro-magnetic radiation. A typical cross-section of the enclosure comprises three parallel layers. The outer and inner surface layers are of a polymeric base material in which is suspended an electrically conductive fill material, giving the surface layers relatively high electrical conductivity. The middle layer is of a polymeric base material, in which is suspended fill material having high magnetic permeability, giving the middle layer relatively high magnetic permeability. In the preferred embodiment, the enclosure is constructed using a co-injection molding process. Nickel-coated graphite (high conductivity) in a polymeric base is injected into a mold from the outer co-injection nozzle, while carbonyl iron powder (high permeability) in a polymeric base is injected into the mold from the inner co-injection nozzle. The resultant molded structure contains the three layers described above, yet can be made inexpensively in a single co-injection molding operation. The enclosure may comprise multiple co-injection molded pieces, which are attached together by any of various conventional means.

4 Claims, 2 Drawing Sheets

U.S. PATENT DOCUMENTS

| | | | |
|---|---|---|---|
| 4,699,743 | 10/1987 | Nakamura et al. | 264/104 |
| 4,751,120 | 6/1988 | Yazaki et al. | 428/35 |
| 4,783,279 | 11/1988 | Petermann et al. | 252/511 |
| 4,804,568 | 2/1989 | Ohsawa et al. | 428/40 |
| 4,871,613 | 10/1989 | Akao | 428/328 |
| 4,876,129 | 10/1989 | Akao | 428/359 |
| 4,890,083 | 12/1989 | Trenkler et al. | 335/301 |
| 4,937,279 | 6/1990 | Betso et al. | 524/417 |
| 5,003,311 | 3/1991 | Roth et al. | 342/2 |
| 5,004,577 | 4/1991 | Ward | 264/272.19 |
| 5,006,394 | 4/1991 | Baird | 428/138 |
| 5,093,054 | 3/1992 | Hirota | 264/255 |
| 5,110,669 | 5/1992 | Knobel et al. | 428/215 |
| 5,137,790 | 8/1992 | Cox et al. | 525/425 |
| 5,317,300 | 5/1994 | Boesel | 264/272.19 |
| 5,326,414 | 7/1994 | Mosher et al. | 264/238 |
| 5,422,055 | 6/1995 | Yalvac et al. | 264/86 |

METHOD FOR MANUFACTURING ELECTRO-MAGNETIC SHIELD HAVING MULTIPLE POLYMERIC LAYERS OF DIFFERING FILL COMPOSITIONS

This is a divisional of application Ser. No. 08/197,574, filed on Feb. 15, 1994, now abandoned which is a continuation of Ser. No. 07/816,696, filed on Jan. 2, 1992, now abandoned.

FIELD OF THE INVENTION

The present invention relates to electro-magnetic shielding materials, and in particular to the construction of covers, enclosures and similar structures housing electronic components to provide a barrier to electro-magnetic radiation.

BACKGROUND OF THE INVENTION

Electronic devices are becoming more prevalent and more complex. Consumer electronics, such as appliances, telephones, entertainment systems, etc., are present in virtually every home. Businesses have integrated electronic devices into offices and factories. Even traditionally mechanical devices, such as automobiles, are incorporating ever larger and more complex electronic elements. Among the most sophisticated and complex electronic devices are modern digital computer systems.

Electronic devices generate and are penetrated by electro-magnetic radiation. The frequencies and amplitudes of the radiation vary depending on the device. Sometimes such radiation is a necessary part of the normal function of the device, as in the case of a radio transmitter communicating information over a selected, tuned electro-magnetic frequency. In most cases, however, such radiation is an unwanted by-product of electronic activity taking place inside the device.

Problems associated with electro-magnetic radiation are particularly acute in the case of digital computing devices. A modern digital computing device typically comprises a large number of very small, active electronic circuit elements such as transistors, switching state and transmitting signals very rapidly. The number of such elements and high switching rate generate considerable electro-magnetic radiation. At the same time, the short time interval within which state switches must be accomplished, make the circuit elements particularly susceptible to stray electro-magnetic radiation generated by other devices. Such stray radiation can cause erroneous state switches, or prevent switches that should occur, resulting in corruption of the electronic signals and loss of data.

In recent years there has additionally been concern over the potential impact of such electro-magnetic radiation on human health. While definitive proof of the nature of any such impact is not yet available, various governmental entities have proposed or promulgated laws, rules or guidelines which limit the amount of radiation emitted by an electronic device. It is possible that as more information concerning the effect of electro-magnetic radiation becomes available, such limits will become more stringent.

Various techniques for shielding electronic devices are known in the art. For example, it is known that solid, continuous metal enclosures of sufficient thickness provide a good barrier to electro-magnetic radiation. However, such enclosures are costly, heavy, or may otherwise interfere with preferred design considerations. It is also known that a molded plastic enclosure having a conductive coating (usually a conductive paint) will provide some degree of protection. Although this solution is relatively lightweight, the coating process, including secondary surface preparation, can add considerable cost to the device, and it does not always provide as the desired degree of shielding.

SUMMARY OF THE INVENTION

It is therefore an object of the present invention to provide an enhanced method and apparatus for shielding against electro-magnetic radiation.

Another object of the present invention to provide enhanced covers, enclosures and similar structures housing electronic components and providing a barrier against electro-magnetic radiation.

Another object of the present invention to provide an enhanced method for constructing covers, enclosures and similar structures housing electronic components and providing a barrier against electro-magnetic radiation.

Another object of this invention is to reduce the cost of constructing covers, enclosures and similar structures housing electronic components and providing a barrier against electro-magnetic radiation.

Another object of this invention is to reduce the electro-magnetic radiation emitted from an apparatus containing electronic components.

Another object of this invention is to provide enhanced protection to electronic components against stray electro-magnetic radiation.

These and other objects will become apparent from the following specification and claims, with reference to the accompanying drawings.

An electronic device comprises a plurality of electronic circuit components located within an enclosure. During normal operation, the electronic circuit components emit electro-magnetic radiation. The enclosure forms a barrier which both blocks and absorbs most of the radiation emitted by the electronic circuitry.

The enclosure may assume an arbitrary shape to conform to the contours of the enclosed components, but a typical cross-section comprises an outer surface layer disposed externally to the device, an inner surface layer disposed internally and facing the electronic circuitry, and a middle layer located between the outer layer and inner layer. The outer and inner layers are of a polymeric base material in which is suspended an electrically conductive fill material, giving the outer and inner layers relatively high electrical conductivity. The middle layer is of a polymeric base material, in which is suspended fill material having high magnetic permeability, giving the middle layer relatively high magnetic permeability and relatively low electrical conductivity.

In operation, electro-magnetic radiation strikes a surface layer, which reflects most of the radiation. The reflection establishes electrical eddy currents in the conductive surface layer, and a consequent magnetic field surrounding the surface layer. The magnetic field becomes concentrated in the high-permeability middle layer, which also absorbs most of the field's energy. Because most of the energy is absorbed in the middle layer, radiation is not transmitted by the eddy currents, as occurs in the case of a single layer of high conductivity and low permeability.

In the preferred embodiment, the enclosure is constructed using a co-injection molding process. Nickel-coated graphite (high conductivity) in a polymeric base is injected into a mold from the outer co-injection nozzle, while carbonyl iron powder (high-permeability) in a polymeric base is injected into the mold from the inner co-injection nozzle. The resultant molded structure contains the three layers described above, yet can be made inexpensively in a single co-injection molding operation. The enclosure may comprise multiple co-injection molded pieces, which are attached together by screws, snap-tabs, or any of various conventional means.

DETAILED DESCRIPTION OF THE PREFERRED EMBODIMENT

Figure 1:
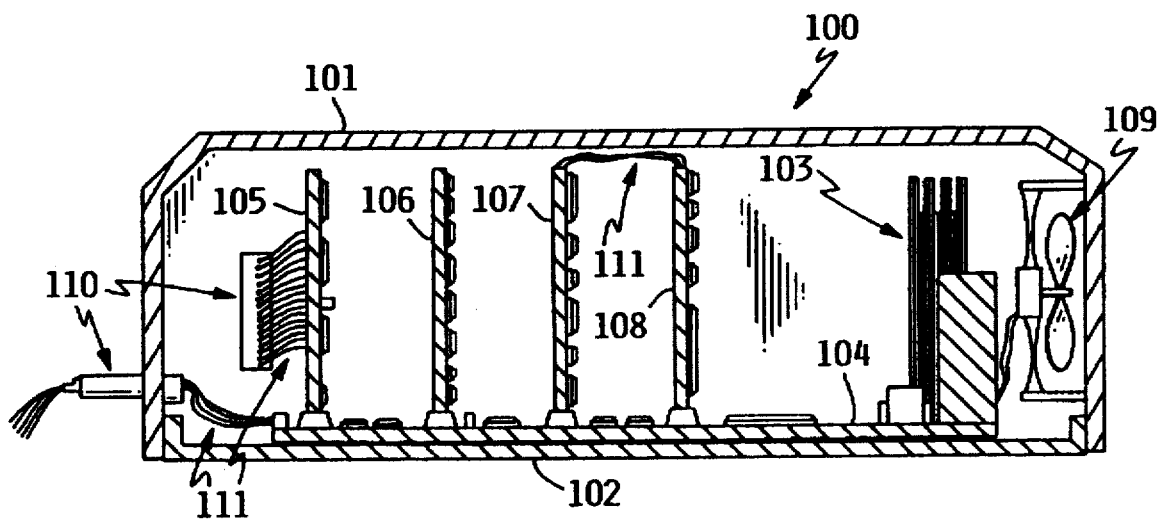
FIG. 1 shows a cross section of a typical electronic device according to the preferred embodiment of this invention.

FIG. 1 depicts a cross-section of a typical electronic device 100 according to the preferred embodiment of the present invention. The device may, e.g., be the system unit of a small computer system known as a personal computer. Device 100 comprises an enclosure, which in this example contains two pieces, a base enclosure part 102 to which the internal components are mounted, and an upper enclosure part 101 which forms the visible outer case of the the system unit, and together with the base piece 102 surrounds and encloses the internal components. Enclosure parts 101, 102 are electrically grounded. The internal components comprise a power supply 103, a cooling fan 109, a plurality of circuit cards 104–108, and wiring interconnecting the circuit cards 111. The internal circuitry can communicate with other electronic devices such as a cathode-ray tube displays, keyboards, modem, etc. via one or more interface cables 110. It should be understood that device 100 may include other components not shown, such as disk drives.

Circuit cards 104–108 comprise a plurality of electronic circuit components which perform the logical function of the device. For example, in the case of a personal computer, such components will typically comprise a programmable microprocessor chip, various memory chips, crystal oscillator, various filter capacitors and resistors, driver chips, etc. Components such as a microprocessor chip and memory chips typically contain a large number of very small transistors on a silicon wafer, switching state at very high speed. The state changes of the electronic circuit components on circuit cards 104–108 tends to generate electro-magnetic radiation in the radio-frequency spectrum. At the same time, such components are very susceptible to ambient radiation. In addition, components such as power supply 103 and fan 109 tend to generate much lower frequency radiation.

Enclosure part 101 is shaped to enclose the electronic components, and to satisfy any other appropriate design constraints such as heat transfer constraints, aesthetic appearance, etc. While parts 101, 102 are are referred to as enclosure parts, it should be understood that they do not necessarily completely enclose the electronic components, and openings may exist in the enclosure. For example, louvers 112 located near fan 109 permit air to flow through the enclosure. It should also be understood that the number of such parts 101, 102 in an enclosure may vary.

Figure 2:
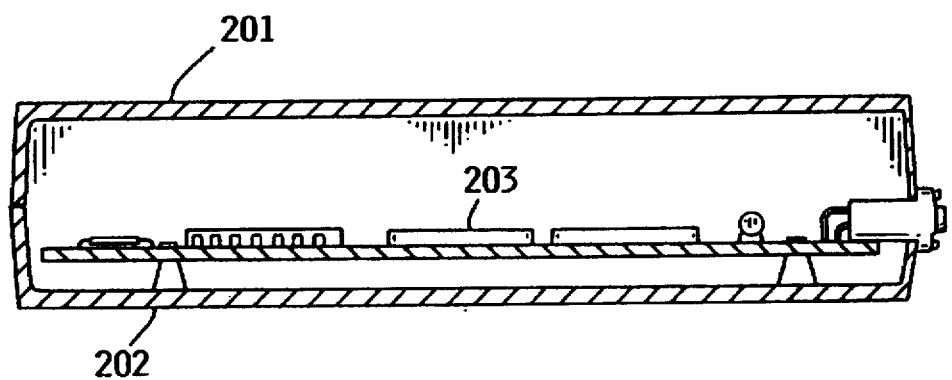
FIG. 2 shows a cross section of an alternative embodiment of this invention in a logic card "book" assembly.

FIG. 2 shows an alternative implementation for an enclosure part of the present invention. In this embodiment, two enclosure parts 201, 202 are used to enclose a circuit card 203, which is part of a larger computer system. Enclosure parts 201, 202 provide mechanical support for circuit card 203, as well as electro-magnetic shielding. A plurality of such circuit card assemblies are contained in a central electronics complex of a computer system, each card assembly providing different logical functions. Such a card assembly is known as a "book", and is described in U.S. Pat. Nos. 4,821,145, to Corfits, et al., and 4,481,146, to Behrens, et al., incorporated herein by reference. However, in the aforementioned patents, construction of enclosure parts 201, 202 in accordance with the present invention is not disclosed.

An enclosure for electronic devices should form a barrier to electro-magnetic radiation of various frequencies. Electronic logic circuits contained in circuit cards 104–8, 203 generate radiation of relatively high frequency (above 1 mega-hertz). Power supplies, fans, and other components generate much lower frequency radiation. In addition, many different high and low frequencies are generated due to the complexity of the device. To construct an effective barrier to electro-magnetic radiation, it is desirable that the barrier have both a high electrical conductivity and a high magnetic permeability.

Shielding of electronic components generally does not involve waves but energy, since the distance from the radiating source to the shield is so small (generally below 6 cm) that near field conditions are dominant. Since the wavelength of electro-magnetic radiation at 1 GHz (the very high end of the spectrum produced by typical electronic components) is approximately 30 cm, there is direct coupling of the component fields with the shield. The far field or radiated wave starts outside the enclosure and is caused by the energy not reflected or absorbed by the shield.

Electro-magnetic shielding is accomplished when surfaces that are in the way of electro-magnetic energy or radiated electro-magnetic waves represent a discontinuity of low impedance. A material of high electrical conductivity reflects the electro-magnetic energy. A material of high magnetic permeability absorbs the electro-magnetic energy. Every surface with the mentioned characteristics attenuates the energy by a certain amount, so that a sandwich of several layers with the same characteristic or a mixture of the two characteristics of conductivity and permeability is useful to achieve the required shielding.

A single high conductivity layer is generally less effective than a sandwich because it simply reflects most of the high frequency energy without dampening it, and may transmit too much low frequency radiation. The reflection establishes electrical eddy currents in the conductive layer, and the resultant fields can transmit the radiation outside the enclosure. Additionally, the high frequency energy trapped within an enclosure having a single highly conductive layer has a tendency to leak out via interconnection wires and other apertures in the enclosure. A sandwich of high conductivity and high permeability layers forms a more effective barrier to this type of radiation.

Figure 3:
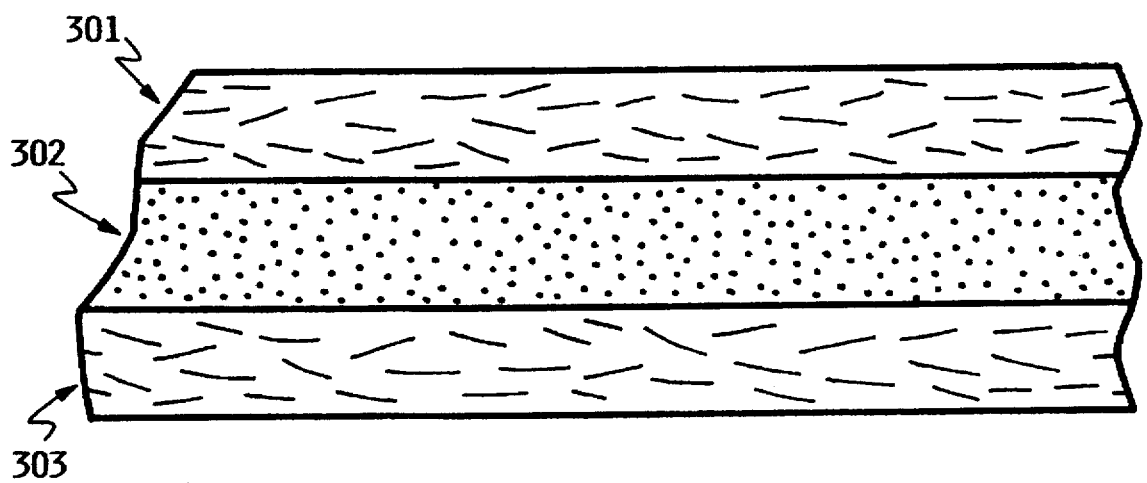
FIG. 3 shows a cross-section of a portion of the enclosure for a typical electronic device according to tile preferred embodiment.

FIG. 3 shows an enlarged cross-section of a portion of enclosure 101 shown in FIG. 1, according to the preferred embodiment. Enclosure 101 part comprises an outer surface layer 301 disposed externally to device 100 and visible to a user, an inner surface layer 303 disposed internally and facing the electronic circuitry inside device 100, and a middle layer 302 located between the outer surface layer and inner surface layer.

In operation, electro-magnetic radiation strikes a high-conductivity surface layer, which reflects most of the radiation, and transmits some small portion of it. The reflection establishes electrical eddy currents in the conductive surface layer, and a consequent magnetic field surrounding the surface layer. Some of the transmitted radiation is also reflected by the surface layer on the opposite side, establishing similar, although greatly attenuated, eddy currents. The magnetic field induced by the eddy currents becomes concentrated in the high-permeability middle layer, which also absorbs most of the field's energy. The surface layers, which have moderate permeability, are also able to absorb some of the field's energy. Because most of the energy is absorbed in the middle layer, radiation is not transmitted by the eddy currents and will have a reduced tendency to leak out of apertures, as occurs in the case of a single layer of high conductivity and low permeability (e.g., a conductive paint on a molded plastic part).

The surface layers 301, 303 are of a polymeric base material in which is suspended an electrically conductive fill material, giving the surface layers relatively high electrical conductivity with respect to air and with respect to the middle layer. The middle layer 302 is of a polymeric base material, in which is suspended fill material having high magnetic permeability, giving the middle layer relatively high magnetic permeability and relatively low electrical conductivity with respect to the surface layers. In the preferred embodiment, surface layers 301, 303 are approximately 0.028–0.031 inches (0.7–0.78 mm) thick, while middle layer 302 is approximately 0.020–0.026 inches (0.5–0.66 mm) thick. However, it should be understood that thicknesses may vary considerably, depending on the structural and other characteristics desired.

In the preferred embodiment, the polymeric base material is a thermoplastic resin suitable for injection molding. More particularly, it is preferred that the base material be a blend of ABS and polycarbonate, having approximately 40% by weight ABS and 60% by weight polycarbonate. Such a suitable base material is marketed commercially by Dow Chemical under the name DOW PULSE 1725 (TM). However, it should be understood that many other polymeric materials could be used in accordance with the present invention.

In the preferred embodiment, surface layers 301, 303 contain approximately 20% by weight nickel-coated graphite fibers, and between 10% and 20% by weight carbonyl iron powder, with the remaining 60% to 70% by weight being the polymeric base material. Suitable nickel-coated graphite fibers average 3/16 inch (4.76 mm) in length and 7.6 microns in diameter, and are available commercially from American Cyanamid. Suitable carbonyl iron powder is a fine powder commercially available from BASF. It should be understood that the type of filler materials stated above and concentrations of such materials may vary. For example, fibers of different size, or different composition such as stainless steel, may be used in place of the nickel-coated graphite of the preferred embodiment.

Surface layers 301, 303 require a relatively high conductivity. The resistivity of the surface layers should be no more than 5 ohms/square, and is preferably in the neighborhood of 2 ohms/square. Because nickel-coated graphite fibers are a relatively expensive filler material (when compared to the cost of carbonyl iron powder or the base ABS/polycarbonate polymer), it is desirable to use no more nickel-coated fibers than necessary to achieve the required conductivity. A composition containing 20% nickel-coated graphite fibers as stated above is sufficient to lower the resistivity of surface layers 301, 303 to approximately 2 ohms/square at the surface thicknesses quoted above. Different thicknesses of the surface layer may require different concentrations of conductive filler material. Carbonyl iron powder is added to the surface composition as an additional fill material to increase the magnetic permeability.

The middle layer is intended to absorb the energy of the radiation, for which it requires a high magnetic permeability. In the preferred embodiment, the middle layer comprises carbonyl iron powder suspended in the base ABS/polycarbonate polymer. Because high permeability is desired, the middle layer should contain as high a content of carbonyl iron powder as can be supported by structural and other constraints. In the preferred embodiment, the middle layer contains 88%–92% carbonyl iron powder by weight, the remaining 8%–12% by weight being the base polymer. The carbonyl iron powder of the middle layer should be of the same type as that used in the surface layers.

It is preferred that middle layer 302 and surface layers 301, 303 contain the same polymeric base material. Since the electro-magnetic shielding properties are due to the filler material, there is generally no reason to use differing polymeric base materials. The use of identical base material promotes good bonding between layers and helps avoid problems that may arise due to different thermal expansion coefficients, different setting temperatures, etc. However, it is not necessary that the polymeric base materials in the different layers be the same, and as an alternative embodiment such base materials could be different.

Figure 4:
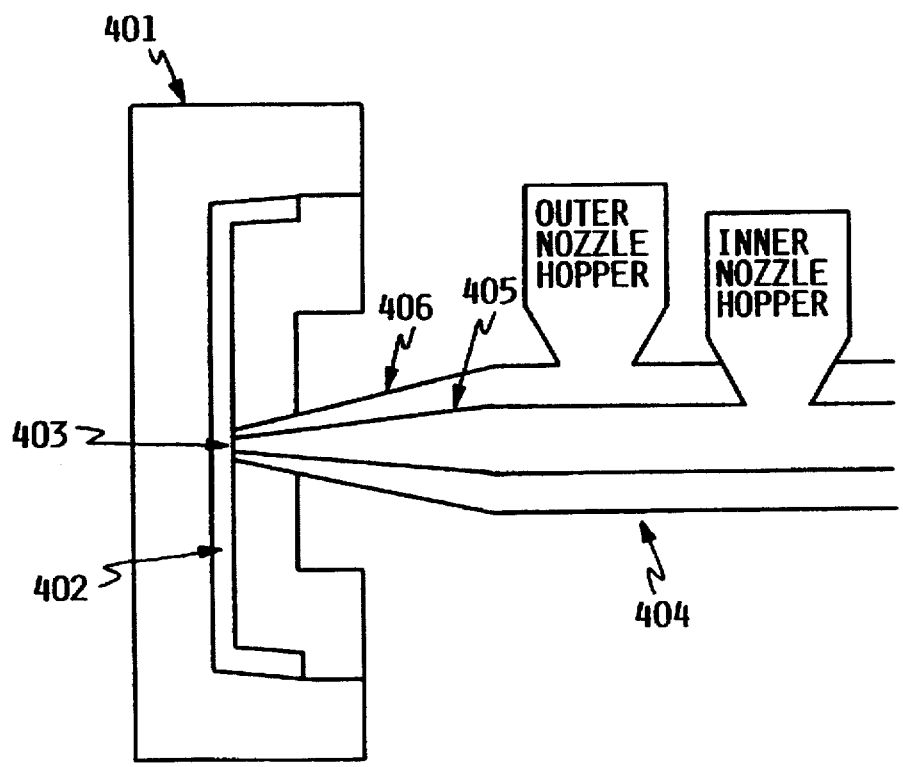
FIG. 4 depicts a co-injection molding apparatus used in the manufacture of an enclosure according to the preferred embodiment.

FIG. 4 depicts a co-injection process used for making an electro-magnetic shielding structure in accordance with the preferred embodiment. A suitably shaped injection mold 401, comprising two or more mold parts, is designed and fabricated according to conventional techniques as are known in the art. Mold 401 defines an internal cavity 402 which is the size and shape of the part to be molded, and contains one or more orifices 403 into the internal cavity, by which a thermoplastic resin composition may be injected.

A co-injection nozzle assembly 404 is used to inject appropriate thermoplastic resin compositions into the cavity 402 through orifice 403. In some cases, multiple nozzle assemblies 404 may be used, each injecting resin composition through a separate orifice. Each nozzle assembly comprises two concentric nozzles, an inner nozzle 405 and an outer nozzle 406. The concentric nozzles are fed material to be injected from separate hoppers, enabling the nozzles to inject different compositions, which is in fact the purpose of co-injection. The composition injected through outer nozzle 406 will line the edges of the cavity, becoming the surface layers of the finished molded part. The composition injected through inner nozzle 405 will form the inner part of the cavity, becoming the middle layer of the finished molded part. In the preferred embodiment, the high conductivity composition of nickel-coated graphite fibers, carbonyl iron powder, and ABS/polycarbonate base is injected through outer nozzle 406, while the high-permeability composition of high concentration carbonyl iron powder and ABS/polycarbonate base is injected through inner nozzle 405.

Although the typical cross-section depicted in FIG. 3 shows the two surface layers separated from each other, the layers are in fact connected to each other at the edges of the molded part and at any through-holes that are molded into the part. Such a connection is an inevitable consequence of the co-injection process. It is also necessary to the function of the part that the conductive surface layers be grounded together, and hence such connections at the periphery are not a disadvantage.

In the preferred embodiment, the layered shielding structure is injection molded using a co-injection molding process. Co-injection molding permits the molded part to be formed in a single step, resulting in a low-cost part. In the alternative, such a part could be formed using double-shot or triple-shot injection molding, in which the part is produced by multiple passes through different molds, as is known in the art. As a further alternative, such a part could be manufactured by multiple steps of pouring the different layer mixtures into a mold, and waiting for each layer to set before pouring the next layer. Additional techniques exist for the construction of layered structures according to the present invention.

In the preferred embodiment, three layers are used to construct a barrier to radiation. The three layer construction is favored because it is easily and inexpensively fabricated using co-injection molding techniques. However, it should be understood that barriers have a different number of layers could be constructed. For example, it may be possible to construct co-injection nozzles assemblies having three concentric nozzles, making a five-layer sandwich possible. Alternatively, additional layers could be constructed with multiple-shot molding techniques or by other means. Other factors being equal, additional layers achieve a higher degree of shielding because each layer effects some attenuation of the electro-magnetic radiation. However, additional layers also add cost. The choice of number of layers is a design option.

In the preferred embodiment, the layered shielding structure of the present invention is part of an enclosure for an electronic device, which can either protect electronic components from ambient radiation, or reduce emissions of radiation from the electronic device. However, such a sandwich-like shielding structure could be used in applications other than electronic device enclosures. For example, a shielding structure according to the present invention may be used to direct or reflect radiation along a particular path.

As an additional example, if deleterious effects to human health can be shown to result from exposure to non-ionizing electro-magnetic radiation, such shields may be used for protection of humans from ambient radiation.

Although a specific embodiment of the invention has been disclosed along with certain alternatives, it will be recognized by those skilled in the art that additional variations in form and detail may be made within the scope of the following claims.

What is claimed is:

1. A method for manufacturing a multiple layer electromagnetic shielding structure, comprising the steps of:
   providing an injection mold of suitable shape for said structure;
   loading an electrically conductive fill material suspended in a polymeric base material in a hopper for an outer nozzle of a co-injection molding press;
   loading a magnetically permeable fill material suspended in a polymeric base material in a hopper for an inner nozzle of a co-injection molding press;
   forming said structure by injecting into said injection mold with said outer nozzle said electrically conductive fill material suspended in a polymeric base material thus forming outer layers of the structure, concurrently with injecting into said injection mold with said inner nozzle said magnetically permeable fill material suspended in a polymeric base, thus forming an inner layer of the structure.

2. The method of claim 1, wherein said magnetically permeable fill material comprises carbonyl iron powder.

3. The method of claim 1, wherein said electrically conductive fill material comprises nickel-coated graphite fibers.

4. The method of claim 1, wherein said polymeric base materials each comprises a blend of ABS and polycarbonate.

* * * * *